US012338528B2

(12) United States Patent
Chang et al.

(10) Patent No.: US 12,338,528 B2
(45) Date of Patent: Jun. 24, 2025

(54) METHOD FOR FABRICATING SEMICONDUCTOR DEVICE WITH DEPOSITION CYCLES OF CHEMICAL VAPOR DEPOSITION PROCESS TO FORM COMPOSITE CONTACT STRUCTURE

(71) Applicant: NANYA TECHNOLOGY CORPORATION, New Taipei (TW)

(72) Inventors: Yu-Chang Chang, Taoyuan (TW); Po-Hung Chen, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 389 days.

(21) Appl. No.: 17/835,073

(22) Filed: Jun. 8, 2022

(65) Prior Publication Data

US 2023/0399738 A1   Dec. 14, 2023

(51) Int. Cl.

| | |
|---|---|
| *C23C 16/08* | (2006.01) |
| *C23C 16/28* | (2006.01) |
| *C23C 16/455* | (2006.01) |
| *C23C 16/56* | (2006.01) |
| *C23C 28/00* | (2006.01) |
| *H01L 21/02* | (2006.01) |
| *H01L 21/302* | (2006.01) |

(52) U.S. Cl.
CPC .............. *C23C 16/08* (2013.01); *C23C 16/28* (2013.01); *C23C 16/45523* (2013.01); *C23C 16/56* (2013.01); *C23C 28/322* (2013.01); *H01L 21/02697* (2013.01); *H01L 21/302* (2013.01)

(58) Field of Classification Search
CPC .......... H01L 21/0228; H01L 21/28556; H01L 21/302; H01L 21/76802–76817; H01L 21/76843; H01L 21/76877–76883; H01L 23/5226
See application file for complete search history.

(56) References Cited

U.S. PATENT DOCUMENTS

| | | | |
|---|---|---|---|
| 9,899,258 B1* | 2/2018 | Wu | ................... H01L 21/76843 |
| 2011/0241140 A1 | 10/2011 | Tsujiuchi et al. | |
| 2013/0109172 A1 | 5/2013 | Collins et al. | |
| 2015/0060872 A1 | 3/2015 | Hosseini et al. | |

(Continued)

FOREIGN PATENT DOCUMENTS

TW          I762302 B      4/2022

*Primary Examiner* — Nelson Garces

(74) *Attorney, Agent, or Firm* — MUNCY, GEISSLER, OLDS & LOWE, P.C.

(57) ABSTRACT

The present application discloses a method for fabricating a semiconductor device. The method includes forming a first dielectric layer on a substrate; forming an expanded hole in the first dielectric layer; conformally forming an adhesive layer in the expanded hole by a first chemical vapor deposition process; conformally forming a first conductive layer on the adhesive layer by a second chemical vapor deposition process; and forming a first conductive structure on the first conductive layer by a third chemical vapor deposition process. The adhesive layer, the first conductive layer, and the first conductive structure together configure a composite contact structure. The second chemical vapor deposition process includes an initial deposition step and subsequent deposition cycles repeated until the first conductive layer is formed to a predetermined thickness.

19 Claims, 11 Drawing Sheets

(56) References Cited

U.S. PATENT DOCUMENTS

| | | | |
|---|---|---|---|
| 2015/0325484 A1* | 11/2015 | Lin | H01L 21/265 |
| | | | 438/301 |
| 2016/0351401 A1* | 12/2016 | Ba | C23C 16/455 |
| 2018/0053660 A1 | 2/2018 | Jandl et al. | |
| 2019/0067093 A1 | 2/2019 | Chang et al. | |
| 2020/0211853 A1* | 7/2020 | Schloss | C23C 16/06 |
| 2022/0037203 A1* | 2/2022 | Tsai | A61F 2/966 |
| 2023/0178432 A1* | 6/2023 | Wojtecki | H01L 21/76801 |
| | | | 257/774 |

\* cited by examiner

METHOD FOR FABRICATING SEMICONDUCTOR DEVICE WITH DEPOSITION CYCLES OF CHEMICAL VAPOR DEPOSITION PROCESS TO FORM COMPOSITE CONTACT STRUCTURE

TECHNICAL FIELD

The present disclosure relates to a method for fabricating a semiconductor device, and more particularly, to a method for fabricating a semiconductor device with a composite contact structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first dielectric layer positioned on the substrate; a first conductive structure positioned in the first dielectric layer and including a bottle-shaped cross-sectional profile; a first conductive layer positioned between the first conductive structure and the first dielectric layer and between the first conductive structure and the substrate; an adhesive layer positioned between the first conductive layer and the first dielectric layer and between the first conductive layer and the substrate. The adhesive layer, the first conductive layer, and the first conductive structure together configure a composite contact structure. An aspect ratio of the composite contact structure is greater than 7.

Another aspect of the present disclosure provides a method for fabricating a semiconductor device including forming a first dielectric layer on a substrate; forming an expanded hole in the first dielectric layer; conformally forming an adhesive layer in the expanded hole by a first chemical vapor deposition process; conformally forming a first conductive layer on the adhesive layer by a second chemical vapor deposition process; and forming a first conductive structure on the first conductive layer by a third chemical vapor deposition process. The adhesive layer, the first conductive layer, and the first conductive structure together configure a composite contact structure. The second chemical vapor deposition process includes an initial deposition step and subsequent deposition cycles repeated until the first conductive layer is formed to a predetermined thickness.

Another aspect of the present disclosure provides a method for fabricating a semiconductor device including forming a first dielectric layer on a substrate; forming an expanded hole in the first dielectric layer; conformally forming an adhesive layer in the expanded hole by a first chemical vapor deposition process; conformally forming a first conductive layer on the adhesive layer by a second chemical vapor deposition process; performing a post-treatment to the first conductive layer; forming a first conductive structure on the first conductive layer by a third chemical vapor deposition process. The adhesive layer, the first conductive layer, and the first conductive structure together configure a composite contact structure. The second chemical vapor deposition process includes an initial deposition step and subsequent deposition cycles repeated until the first conductive layer is formed to a predetermined thickness. The post-treatment includes introducing diborane pulses to the first conductive layer.

Due to the design of the method for fabricating the semiconductor device of the present disclosure, the sidewall coverage may be improved by increasing repeating times of the deposition cycles of the second chemical vapor deposition process. In addition, the first conductive structure may have greater grain size and improved resistivity by employing the post-treatment to the first conductive layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
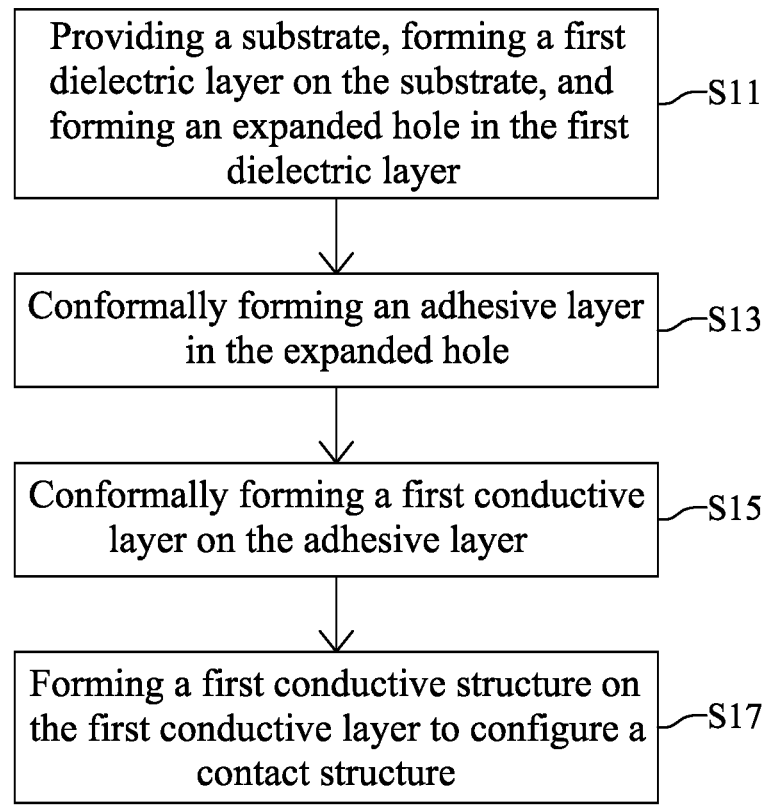
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1 in accordance with one embodiment of the present disclosure. FIGS. 2 to 5 illustrate, in schematic cross-sectional view diagrams, part of a flow for fabricating the semiconductor device 1 in accordance with one embodiment of the present disclosure. FIG. 6 is a chart showing an example of process conditions for forming an adhesive layer 101 in accordance with one embodiment of the present disclosure.

With reference to FIGS. 1 to 4, at step S11, a substrate 201 may be provided, a first dielectric layer 203 may be formed on the substrate 201, and an expanded hole 403 may be formed in the first dielectric layer 203.

Figure 2:
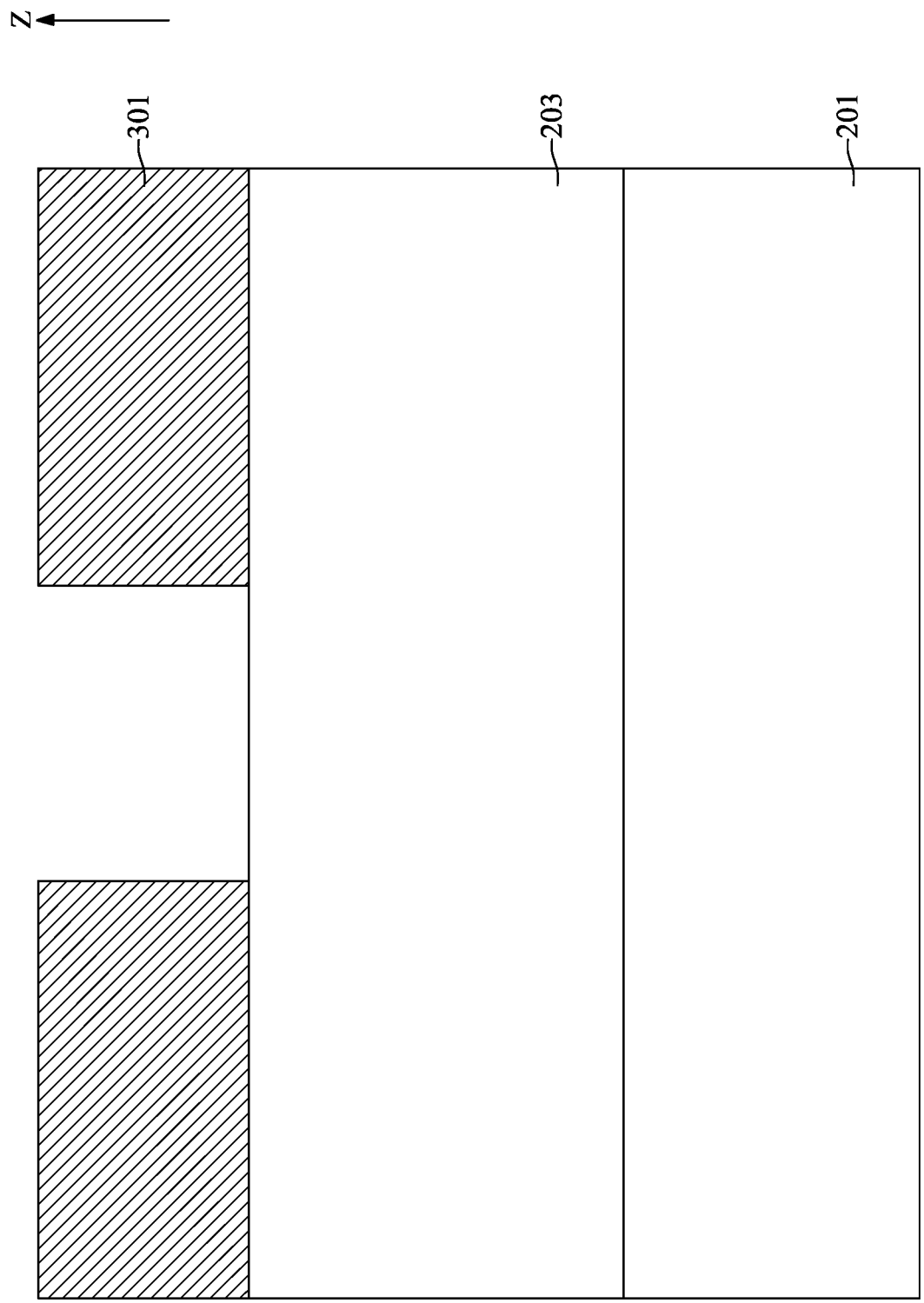
FIGS. 2 to 5 illustrate, in schematic cross-sectional view diagrams, part of a flow for fabricating the semiconductor device in accordance with one embodiment of the present disclosure.

With reference to FIG. 2, the substrate 201 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 201 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 201. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, in some embodiments, the first dielectric layer 203 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 203 may include a self-planarizing material such as a spin-on glass or a spin-on low-k dielectric material such as SiLK™ The use of a self-planarizing dielectric material may avoid the need to perform a subsequent planarizing step. In some embodiments, the first dielectric layer 203 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps. In some embodiments, the first dielectric layer 203 may be the topmost dielectric layer of the substrate 201.

Figure 3:
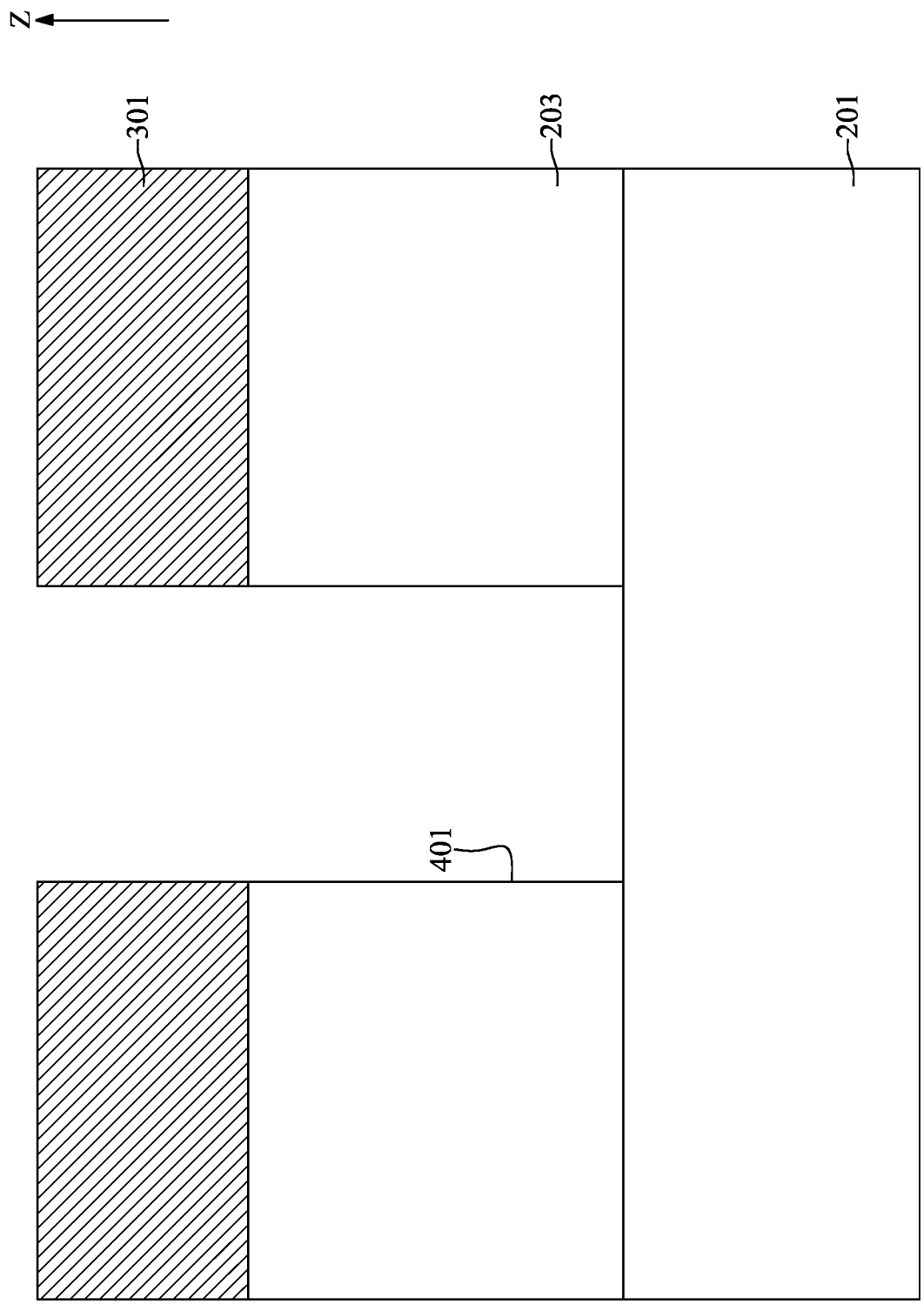

With reference to FIG. 3, a first mask layer 301 may be formed on the first dielectric layer 203. In some embodiments, the first dielectric layer 203 may be a photoresist layer.

With reference to FIG. 3, an anisotropic etch process may be performed to remove portions of the first dielectric layer 203 and concurrently form a hole 401 to expose a portion of the substrate 201. In some embodiments, the anisotropic etch process may be an anisotropic dry etching process. In some embodiments, the etch rate ratio of the first dielectric layer 203 to the substrate 201 may be between about 100:1 and about 1.05:1, between about 15:1 and about 2:1, or between about 10:1 and about 2:1 during the anisotropic etch process. In some embodiments, no substrate 201 is exposed through the hole 401.

Figure 4:
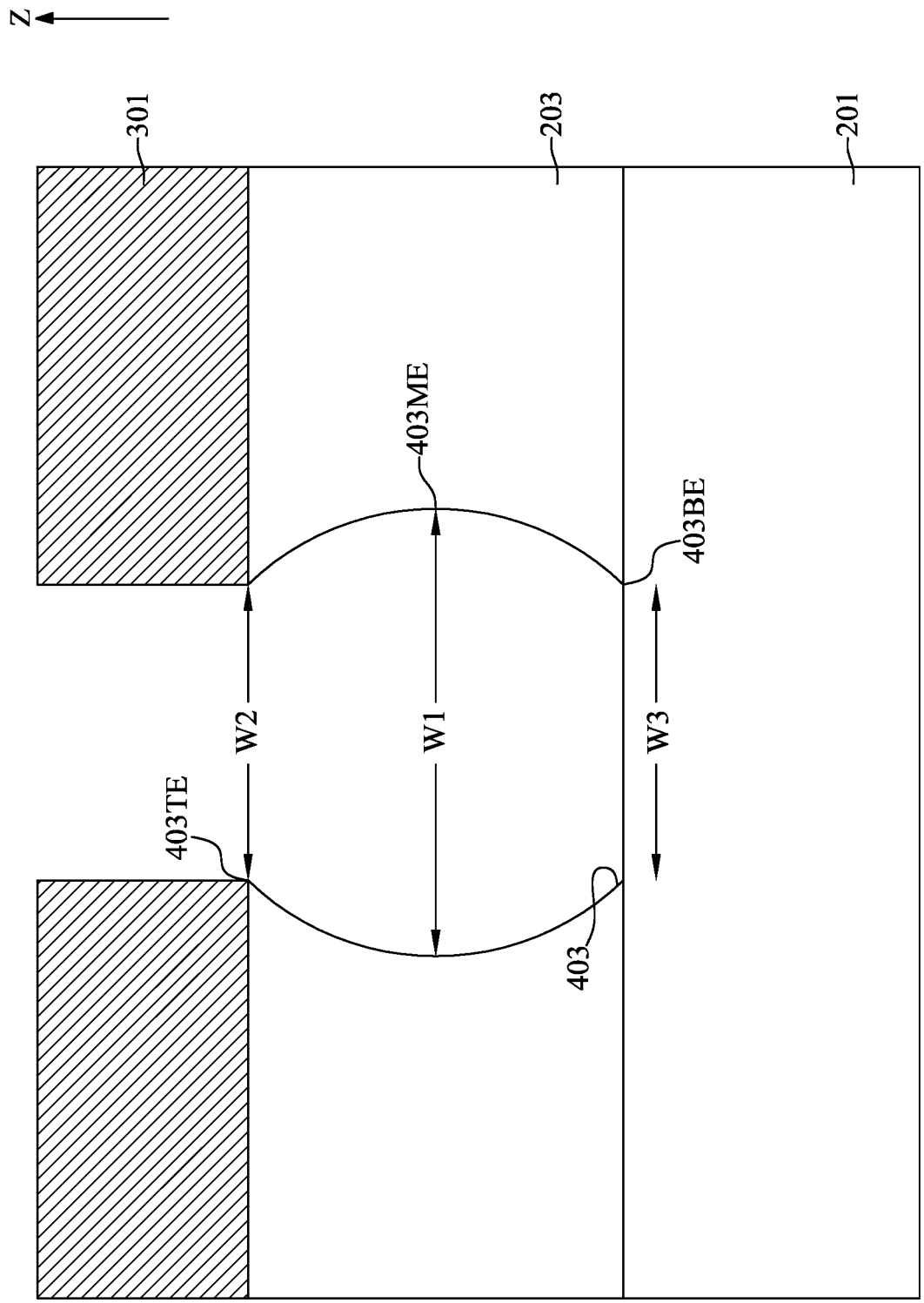

With reference to FIG. 4, an expansion etch process may be performed to expand the hole 401 into the expanded hole 403. In some embodiments, the expansion etch process may be an isotropic etch process. In some embodiments, the expansion etch process may be a wet etch process. In some embodiments, the etch rate ratio of the first dielectric layer 203 to the substrate 201 may be between about 100:1 and about 1.05:1, between about 15:1 and about 2:1, or between about and about 2:1 during the expansion etch process.

In some embodiments, the sidewall of the expanded opening 523 may be curved. In some embodiments, the width W1 of the middle ends 403ME of the expanded hole 403 may be greater than the width W2 of the top ends 403TE of the expanded hole 403. In some embodiments, the width W1 of the middle ends 403ME of the expanded hole 403 may be greater than the width W3 of the bottom ends 403BE of the expanded hole 403. In some embodiments, the width W2 of the top ends 403TE of the expanded hole 403 and the width W3 of the bottom ends 403BE of the expanded hole 403 may be substantially the same. In some embodiments, the width W2 of the top ends 403TE of the expanded hole 403 and the width W3 of the bottom ends 403BE of the expanded hole 403 may be different. For example, the width W2 of the top ends 403TE of the expanded hole 403 may be greater than the width W3 of the bottom ends 403BE of the expanded hole 403. In some embodiments, the aspect ratio (a ratio of depth over width) of the expanded hole 403 may be no less than 7.

Figure 5:
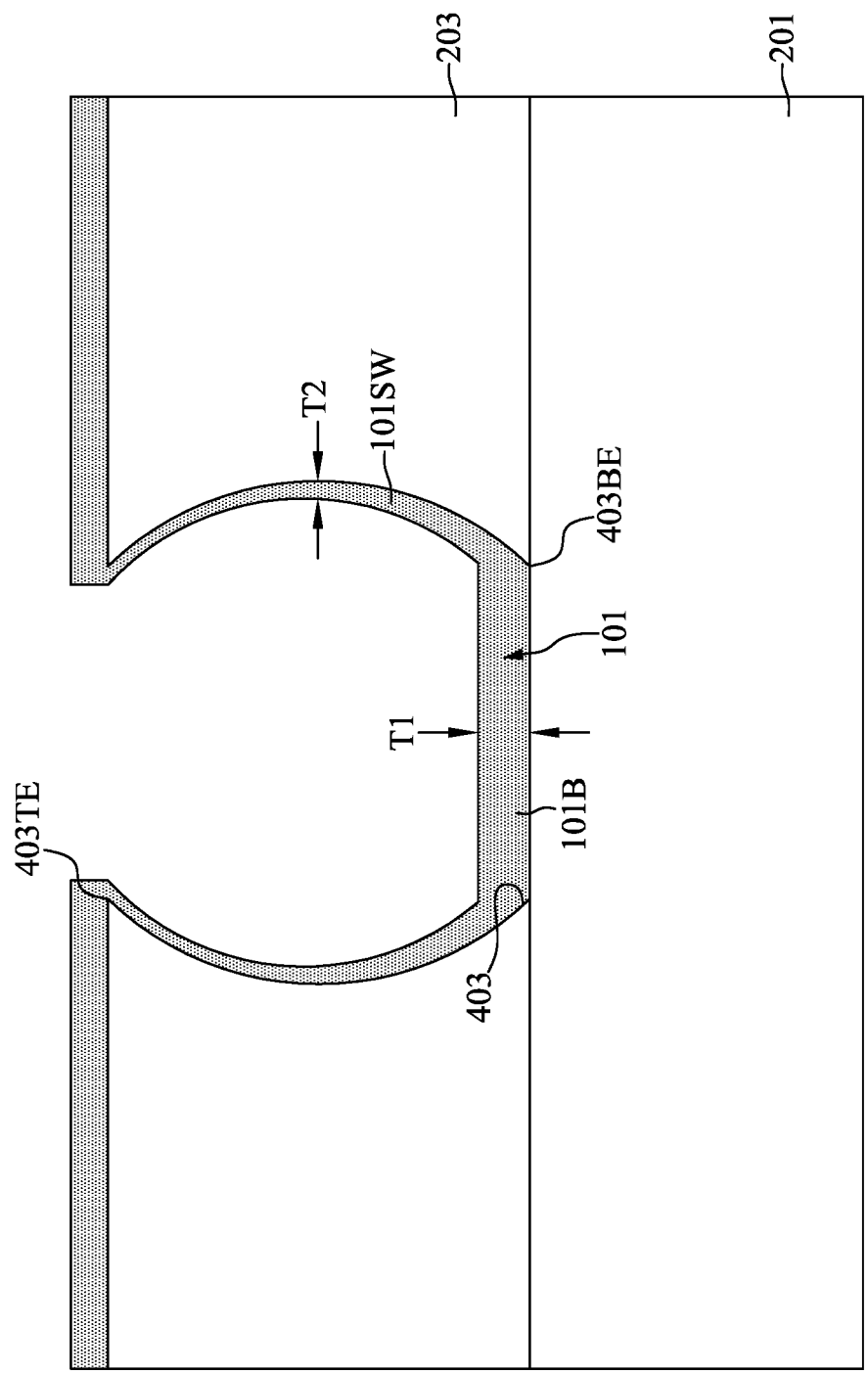
Figure 6:
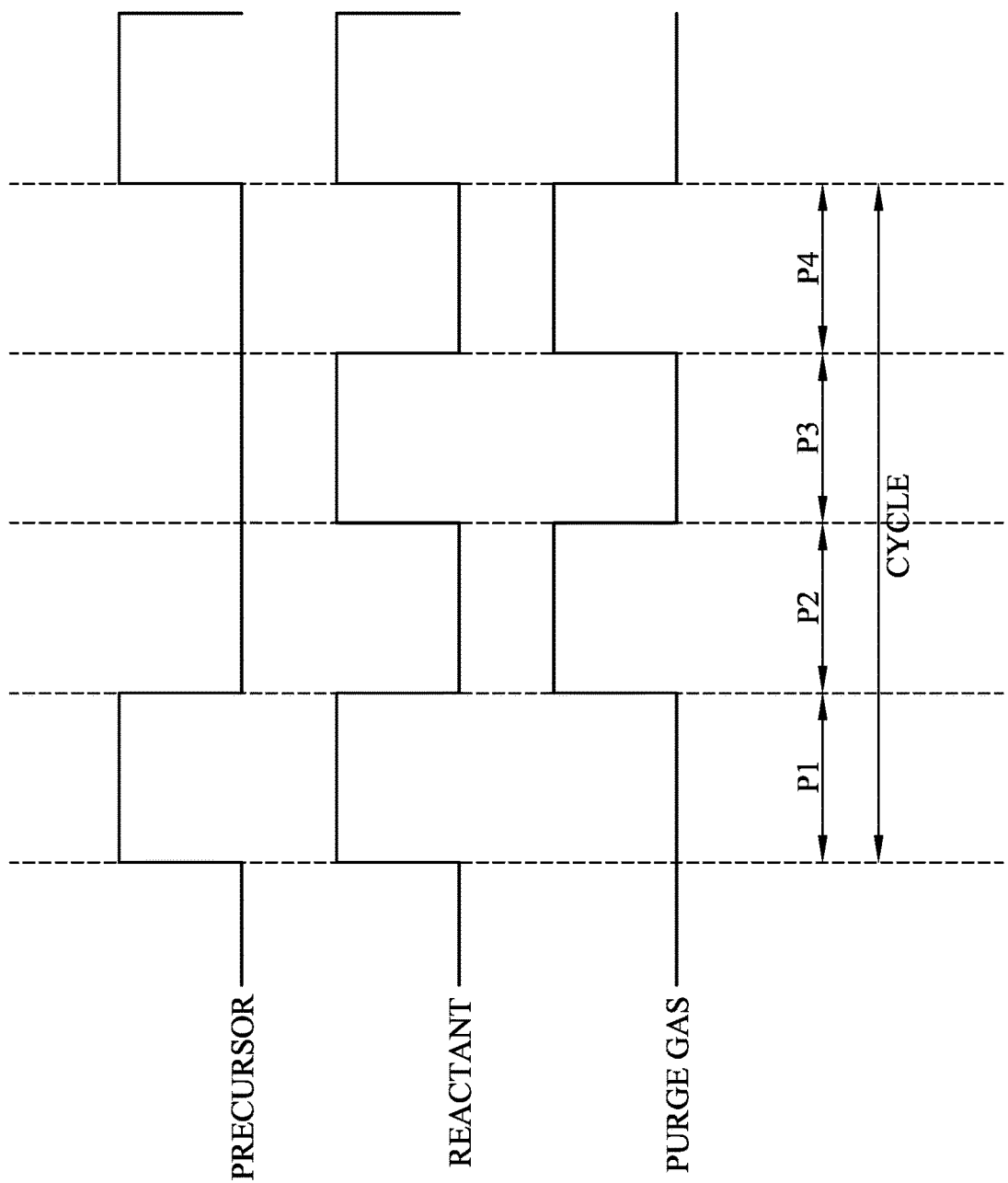
FIG. 6 is a chart showing an example of process conditions for forming an adhesive layer in accordance with one embodiment of the present disclosure.

With reference to FIGS. 1, 5, and 6, at step S13, the adhesive layer 101 may be conformally formed in the expanded hole 403.

With reference to FIG. 5, the first mask layer 301 may be removed. Subsequently, the adhesive layer 101 may be conformally formed on the top surface of the first dielectric layer 203 and in the inner surface of the expanded hole 403 (i.e., the sidewall and the bottom surface of the expanded hole 403). The thickness T1 of the bottom portion 101B of the adhesive layer 101 may be greater than the thickness T2 of the sidewall portion 101SW of the adhesive layer 101. In some embodiments, the thickness T2 of the sidewall portion 101SW of the adhesive layer 101 may gradually decrease from the bottom ends 403BE of the expanded hole 403 towards the top ends 403TE of the expanded hole 403. In some embodiments, the adhesive layer 101 may be formed of a conductive material with great adhesion to the first dielectric layer 203 (and/or the substrate 201) and the subsequently formed layer. In some embodiments, the adhesive layer 101 may be formed of, for example, titanium, titanium nitride, tantalum, tantalum nitride, or the like. In the present embodiment, the adhesive layer 101 is formed of titanium nitride.

With reference to FIGS. 5 and 6, the adhesive layer 101 may be formed by chemical vapor deposition (also referred to as the first chemical vapor deposition process). Detailedly, the formation of the adhesive layer 101 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the adhesive layer 101.

For example, the intermediate semiconductor device illustrated in FIG. 4 (after removing the first mask layer 301) may be loaded in a reaction chamber. In the source gas introducing step, during a period P1, source gases containing a precursor and a reactant may be introduced to the reaction chamber. The precursor and the reactant may diffuse across a boundary layer and reach the surface of the intermediate semiconductor device illustrated in FIG. 4 (i.e., the top surface of the first dielectric layer 203 and the inner surface of the expanded hole 403). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, during a period P2, a purge gas such as argon may be injected into the reaction chamber to purge out the gaseous byproducts, unreacted precursor, and unreacted reactant.

In the reactant flowing step, during a period P3, the reactant may be solely introduced to the reaction chamber to turn the continuous thin film into the adhesive layer 101. In the second purging step, during a period P4, a purge gas such as argon may be injected into the reaction chamber to purge out the gaseous byproducts and unreacted reactant.

In some embodiments, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the adhesive layer 101.

In some embodiments, the formation of the adhesive layer 101 using the chemical vapor deposition may be performed with the assistance of plasma. The source of the plasma may be, for example, argon, hydrogen, or a combination thereof.

It should be noted that the adhesive layer 101 formed by the first chemical vapor deposition may have relatively large grain size as compared to an adhesive layer 101 formed by an atomic layer deposition process. As a result, the conductivity of the adhesive layer 101 formed by the first chemical vapor deposition may be improved.

Figure 7:
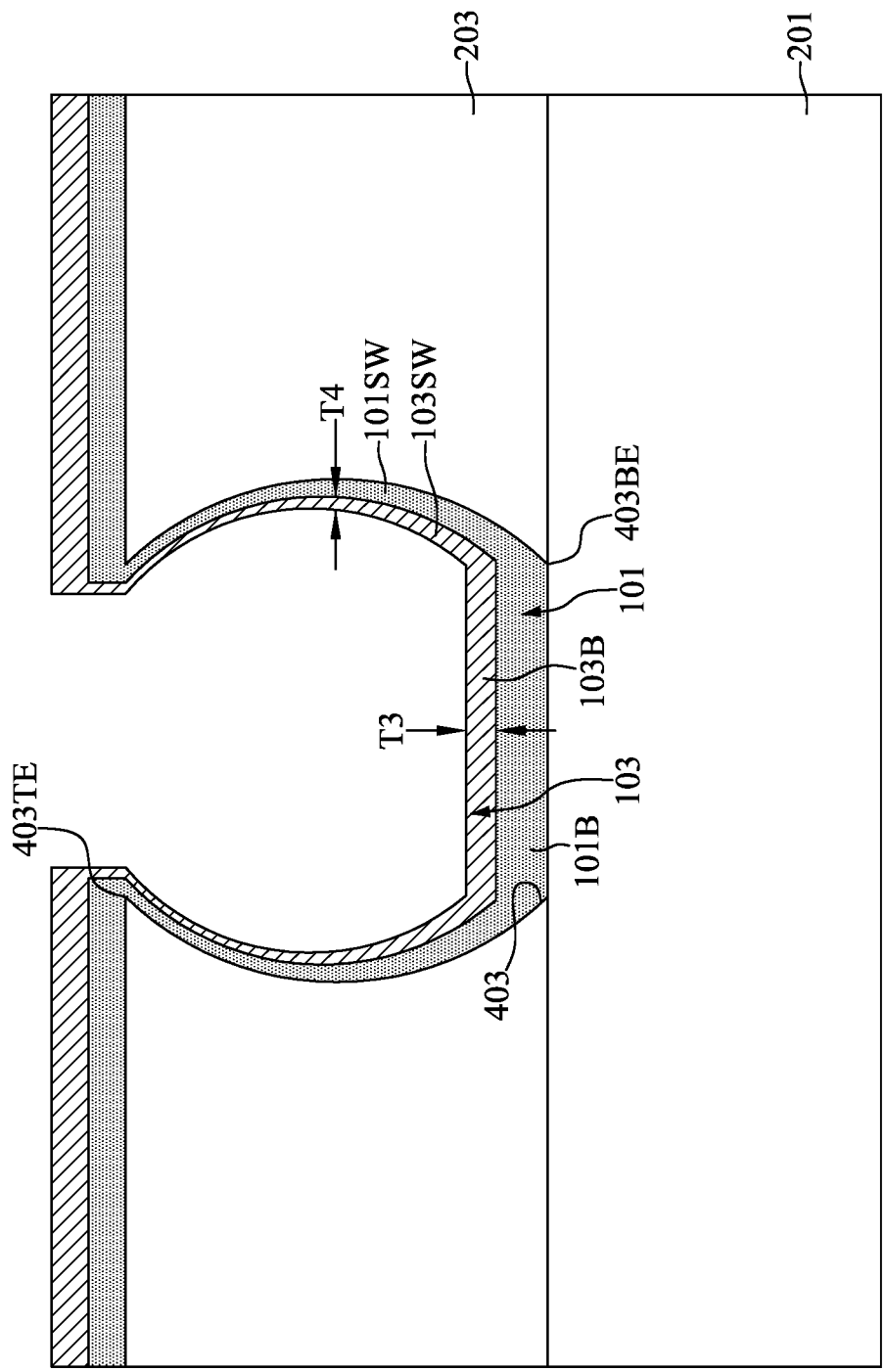
FIG. 7 illustrates, in a schematic cross-sectional view diagram, part of the flow for fabricating the semiconductor device in accordance with one embodiment of the present disclosure.
Figure 8:
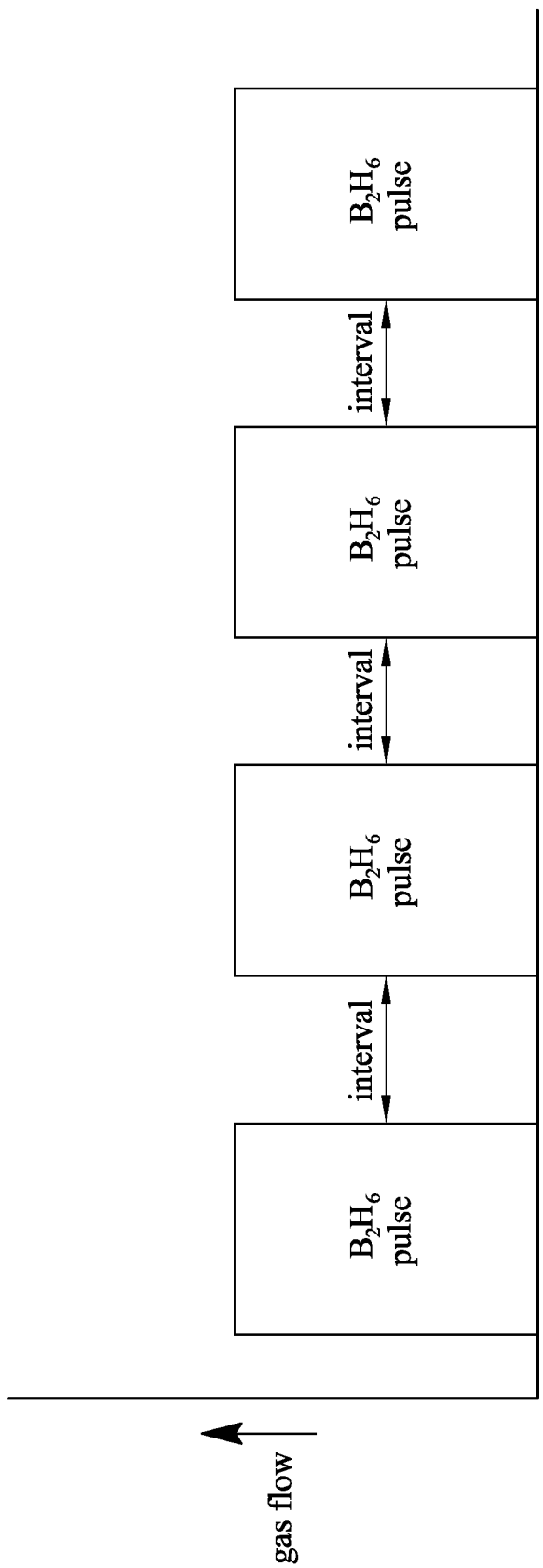
FIG. 8 is a graph representing reducing agent pulses and interval times of a post-treatment in accordance with one embodiment of the present disclosure.

FIG. 7 illustrates, in a schematic cross-sectional view diagram, part of the flow for fabricating the semiconductor device 1 in accordance with one embodiment of the present disclosure. FIG. 8 is a graph representing reducing agent pulses and interval times of a post-treatment in accordance with one embodiment of the present disclosure.

Figure 9:
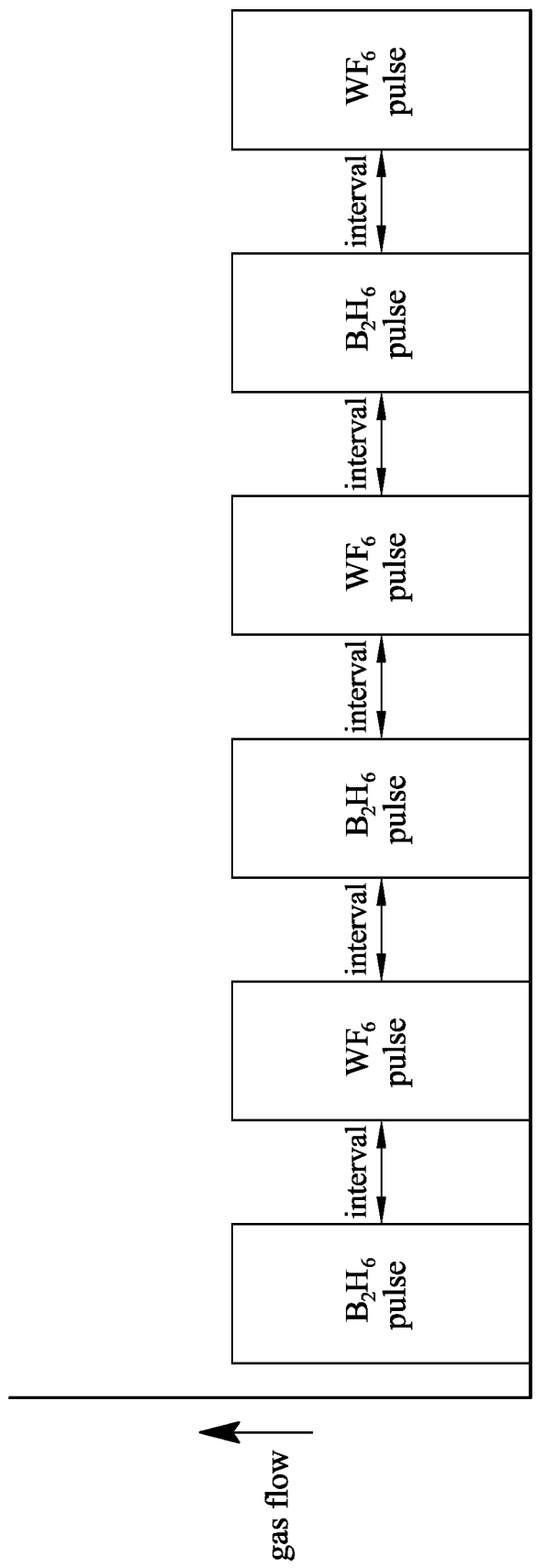
FIG. 9 is a graph representing reducing agent pulses and interval times of a post-treatment in accordance with another embodiment of the present disclosure.

FIG. 9 is a graph representing reducing agent pulses and interval times of a post-treatment in accordance with another embodiment of the present disclosure. The vertical axis represents gas flow rate, and the horizontal axis represents time.

With reference to FIG. 1 and FIGS. 7 to 9, at step S15, a first conductive layer 103 may be conformally formed on the adhesive layer 101.

With reference to FIG. 7, the first conductive layer 103 may be conformally formed on the adhesive layer 101 and in the expanded hole 403. The thickness T3 of the bottom portion 103B of the first conductive layer 103 may be greater than the thickness T4 of the sidewall portion 103SW of the first conductive layer 103. In some embodiments, the thickness T3 of the bottom portion 103B of the first conductive layer 103 may gradually decrease from the bottom ends 403BE of the expanded hole 403 towards the top ends 403TE of the expanded hole 403. In some embodiments, the first conductive layer 103 may be formed of, for example, copper, a copper alloy, silver, gold, tungsten, aluminum, nickel, or the like. In the present embodiment, the first conductive layer 103 is formed of tungsten.

With reference to FIG. 7, the first conductive layer 103 may be formed by, for example, a pulsed nucleation layer method (also referred to as the second chemical vapor deposition process). Generally, in the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the adhesive layer 101), available to react with the next reactant (e.g., the second reactant). The process is repeated in a cyclical fashion (also referred to as the deposition cycles) until the desired thickness is achieved.

It should be noted that the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

For example, the deposition cycles of the second chemical vapor deposition process may include pulses of a silicon-containing reducing agent and pulses of a tungsten-containing precursor. The adhesive layer 101 may be initially exposed to the pulse of the silicon-containing reducing agent and followed by exposure to the pulse of the tungsten-containing precursor. The exposure to the pulse of the silicon-containing reducing agent and the pulse of the tungsten-containing precursor may be defined as one deposition cycle. The deposition cycle may be repeated until the desired thickness of the first conductive layer 103 is achieved. By increasing repeating times of the deposition cycles of the second chemical vapor deposition process, the first conductive layer 103 may cover the sidewall portion 101SW of the adhesive layer 101 better, and have less overhang at the top ends 403TE of the expanded hole 403.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the pulses of the silicon-containing reducing agent of the deposition cycles may be between about 200° C. and about 475° C., between about 300° C. and about 400° C., or about 300° C. In some embodiments, the chamber pressure during exposure to the pulses of the silicon-containing reducing agent of the deposition cycles may be between about 1 Torr and about 350 Torr or be fixed around 40 Torr. The exposure time (or pulse time) may vary depending in part upon dosages and chamber conditions. In some embodiments, the adhesive layer 101 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

Once the adhesive layer 101 is sufficiently covered with silane species, the pulses of the silicon-containing reducing agent may be stopped. A purge process may be performed to clear residual gas reactants near the surface of the adhesive layer 101. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the pulses of the tungsten-containing precursor of the deposition cycles may be between about 200° C. and about 475° C., between about 300° C. and about 400° C., or about 300° C. In some embodiments, the chamber pressure during exposure to the pulses of the tungsten-containing precursor of the deposition cycles may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the first conductive layer 103. Thereafter, the pulses of the tungsten-containing precursor may be stopped, and a purge process may be performed with a carrier gas such as argon, hydrogen, nitrogen, or helium.

Conventionally, an additional layer may be formed using atomic layer deposition to improve the sidewall coverage of the first conductive layer 103. In contrast, in the present embodiment, the sidewall coverage may be improved by increasing repeating times of the deposition cycles of the second chemical vapor deposition process. Therefore, the additional layer is not required. As a result, the complexity and the cost of fabricating the semiconductor device 1 may be reduced.

In some embodiments, the second chemical vapor deposition process may include performing an initial deposition step before the deposition cycles of the pulsed nucleation layer method (i.e., the second chemical vapor deposition). In some embodiments, the initial deposition step may include providing a borane-containing precursor pulse and a subsequent tungsten-containing precursor pulse, each followed by a purge pulse. In some embodiments, the borane-containing precursor of the initial deposition step may be, for example, borane, diborane, triborane, or boron halides (e.g., $BF_3$, $BCl_3$) with hydrogen. In some embodiments, the borane-containing precursor of the initial deposition step may be provided in a dilution gas, accompanied with gases such as argon, nitrogen, hydrogen, silane, or a combination thereof. For example, diborane may be provided from a diluted source (e.g., 5% diborane and 95% nitrogen).

In some embodiments, the substrate temperature during the borane-containing precursor pulse of the initial deposition step may be between about 200° C. and about 475° C., between about 300° C. and about 400° C., or about 300° C. In some embodiments, the chamber pressure during the borane-containing precursor pulse of the initial deposition step may be between about 1 Torr and about 350 Torr.

In some embodiments, the tungsten-containing precursor of the initial deposition step may include tungsten hexafluoride, tungsten hexachloride, or tungsten hexacarbonyl, or organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor of the initial deposition step may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr.

With reference to FIG. 8, in some embodiment, after the formation of the first conductive layer 103, a post-treatment may be performed to the first conductive layer 103. During the post-treatment, the first conductive layer 103 may be exposed to one or more pulses of reducing agent(s) prior to forming a subsequently conductive layer on the first conductive layer 103. Exposure to the reducing agent pulse(s) may improve the resistivity of the overall structure including the first conductive layer 103 and the subsequently conductive layer which will be illustrated layer.

With reference to FIG. 8, the first conductive layer 103 may be exposed to multiple reducing agent pulses with interval times between the pulses. During an interval time, no reducing agent flows to the first conductive layer 103. In some embodiments, the reducing agent may be diborane, though other reducing agents may be used. In some embodiments, the flow rate of the reducing agent during a pulse is between about 100 standard cubic centimeters per minute (sccm) and 500 sccm. In some embodiments, the pulse time (or duration of pulse) of each reducing agent pulse may be between about 0.5 seconds and about 5 seconds, or between about 1 seconds and 2 seconds. In some embodiments, the number of reducing agent pulses may be between 2 and 8. In some embodiments, the process pressure of the post-treatment may be between about 2 Torr and about 100 Torr, or between about 20 Torr and about 40 Torr.

In some embodiments, the reducing agent may be provided in a dilution gas, accompanied with gases such as argon, nitrogen, hydrogen, silane, or a combination thereof. For example, diborane may be provided from a diluted source (e.g., 5% diborane and 95% nitrogen). In some embodiments, an inert gas/hydrogen gas mixture may continuously flow to the first conductive layer 103 during both the reducing agent pulses and the interval times of the post-treatment. In some embodiments, the inert gas may be argon. In contrast, no other gases, other than a continuously flowing inert gas/hydrogen mixture or other background gas, flow to the post-treatment during the interval times of the post-treatment, i.e., there are no intervening pulse operations during the interval time between the reducing agent pulses.

In some embodiments, the intermediate semiconductor device illustrated in FIG. 5 may be pre-heated to between about 375° C. and about 415° C., or about 395° C. to stabilize before the post-treatment. In some embodiments, the intermediate semiconductor device after the post-treatment may be heated to between about 375° C. and about 415° C., or about 395° C. The preheat process before exposing the post-treatment and the thermal treatment after the post-treatment may enhance film adhesion and improve sheet resistance percent non-uniformity.

In some embodiments, the first conductive layer 103 may be exposed to an additional tungsten-containing precursor after the post-treatment to form an additional portion of the first conductive layer 103 before depositing the subsequently conductive layer on the first conductive layer 103. Any suitable tungsten containing precursor may be used. For example, the tungsten-containing precursor may include tungsten hexafluoride, tungsten hexachloride, or tungsten hexacarbonyl. The tungsten-containing precursor may be provided in a dilution gas accompanying with gases such as argon, nitrogen, hydrogen, or a combination thereof.

With reference to FIG. 9, alternatively, in some embodiments, the first conductive layer 103 may be alternatively exposed to multiple pulses of reducing agents with interval times between the pulses. During an interval, no reducing agent flows to the first conductive layer 103. In some embodiments, the reducing agents such as diborane and a tungsten-containing precursor may alternatively flow (or introduce) to the first conductive layer 103.

In some embodiments, the flow rate of the diborane may be between about 100 sccm and about 500 sccm, or about 300 sccm. In some embodiments, the tungsten-containing precursor may include, for example, tungsten hexafluoride, tungsten hexachloride, or tungsten hexacarbonyl. The flow rate of the tungsten-containing precursor may be between about 100 sccm and about 500 sccm, or about 100 sccm. In some embodiments, the pulse time (or duration of pulse) may be between about 0.5 seconds and 5 seconds, or between about 1 seconds and 2 seconds. In some embodiments, the interval time between each pulse may be between about 2 seconds and about 5 seconds. In some embodiments, the number of pulses may be between 2 and 8. In some embodiments, the chamber pressure may be between about 2 Torr and about 100 Torr, or between about 20 Torr and about 40 Torr.

In some embodiments, the pulse time should be short enough to ensure that no or substantially no tungsten deposits. In some embodiments, the amount of the tungsten-containing precursor applied to the first conductive layer 103 during the post-treatment may be less than the amount of tungsten-containing precursor applied to the adhesive layer 101 during forming the first conductive layer 103. In some embodiments, the pulse time of the tungsten-containing precursor applied to the first conductive layer 103 during the post-treatment may be less than the pulse time of tungsten-containing precursor applied to the adhesive layer 101 during forming the first conductive layer 103.

In certain embodiments, the reducing agent and tungsten-containing precursor pulses may be as short as less than 1 second. In one example, diborane ($B_2H_6$) may be pulsed for 1 second, followed by a 1 second purge, followed by a tungsten hexafluoride ($WF_6$) pulse of 1 second, followed by a 2.5 second purge. This cycle is then repeated four times.

No bound by a particular theory, it is believed that the introduction of the tungsten hexafluoride pulses between diborane pulses may help scavenge unreacted diborane, which otherwise promotes the onset of micropeeling, from the surface of the first conductive layer 103.

In some embodiments, the post-treatment may be performed between about 10 seconds and about 50 seconds, or between about 10 seconds and about 30 seconds. Longer post-treatment time (or duration) may induce decomposition of diborane which has an adverse effect on the resistivity of the subsequent conductivity layer.

In some embodiments, an etching process may be performed after formation of the first conductive layer 103 to remove overhang of the first conductive layer 103 (if any) at the top ends 403 TE of the expanded hole 403. In some embodiments, the etching process may be an anisotropic etching process. In some embodiments, the etching process may be performed before the post-treatment. In some embodiments, the etching process may be performed after the post-treatment.

Figure 10:
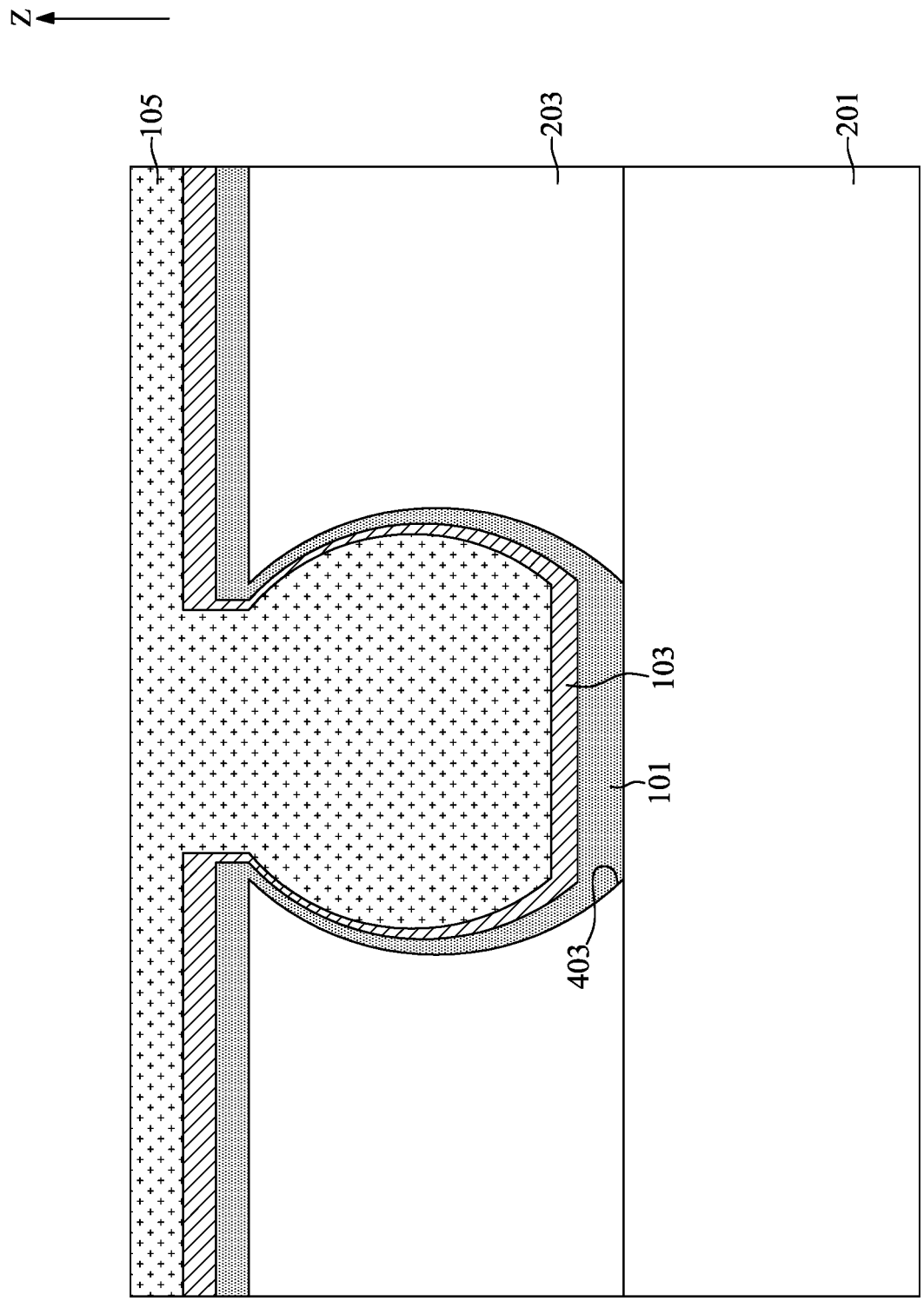
FIGS. 10 and 11 illustrate, in schematic cross-sectional view diagrams, part of the flow for fabricating the semiconductor device in accordance with one embodiment of the present disclosure.
Figure 11:
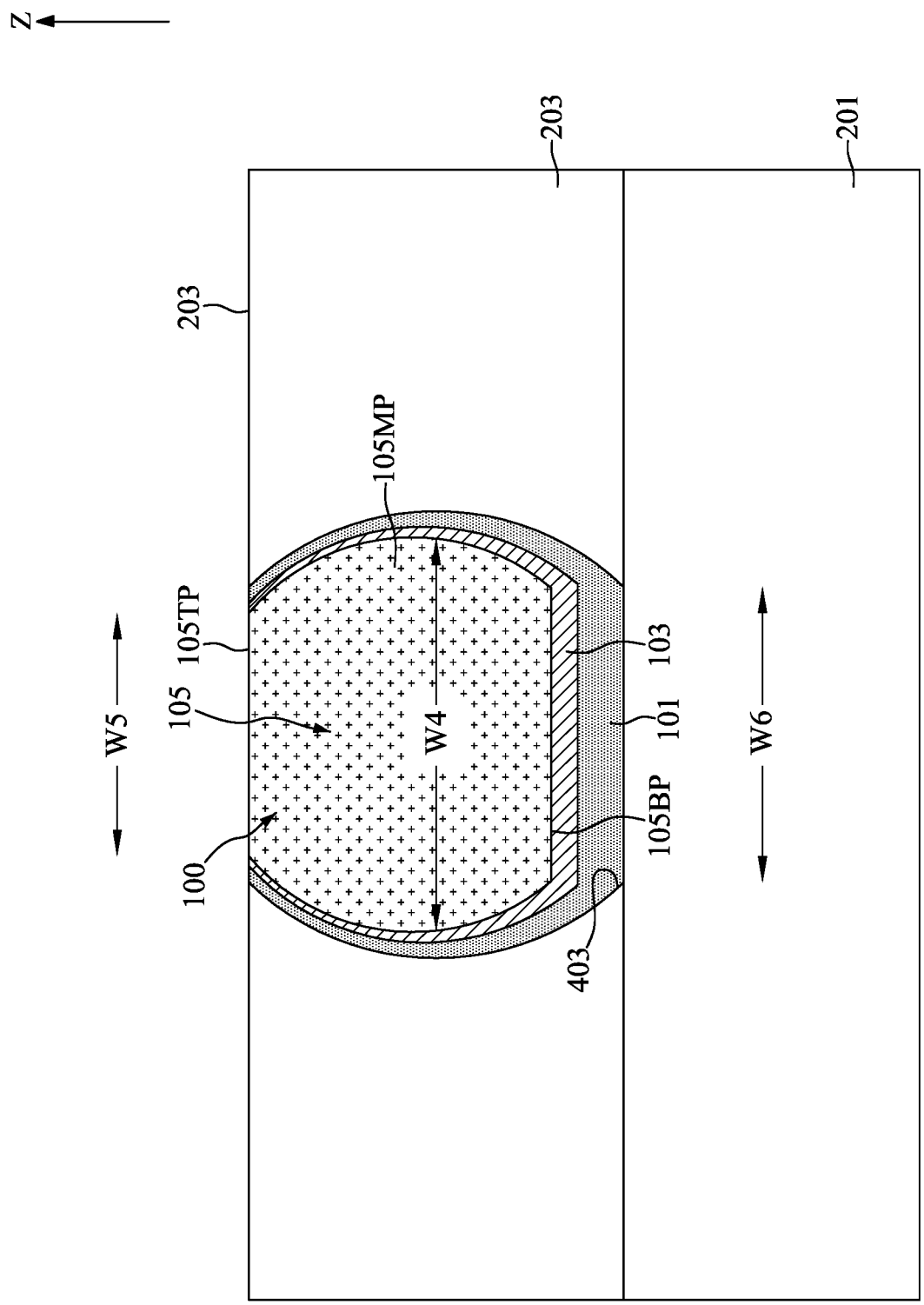

FIGS. 10 and 11 illustrate, in schematic cross-sectional view diagrams, part of the flow for fabricating the semiconductor device 1 in accordance with one embodiment of the present disclosure.

With reference to FIGS. 1, 10, and 11, at step S17, a first conductive structure 105 may be formed on the first conductive layer 103 to configure a composite contact structure 100.

With reference to FIG. 10, a first conductive structure 105 may be formed on the first conductive layer 103 and completely fill the expanded hole 403. In some embodiments, the first conductive structure 105 may be formed of the same material as the first conductive layer 103 (e.g., tungsten). The first conductive structure 105 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof. In the present embodiment, the first conductive structure 105 is formed by chemical vapor deposition (also referred to as the third chemical vapor deposition).

In some embodiments, the third chemical vapor deposition may include an initial deposition step, deposition cycles, and a bulk step. The initial deposition step of the third chemical vapor deposition may be performed with a procedure similar to the initial deposition step of the second chemical vapor deposition illustrated in FIG. 7, and descriptions thereof are not repeated herein. The deposition cycles of the third chemical vapor deposition may be performed with a procedure similar to the deposition cycles of the second chemical vapor deposition illustrated in FIG. 7, and descriptions thereof are not repeated herein. The bulk step of the third chemical vapor deposition may include flowing (or introducing) a tungsten-containing precursor and a co-reactant such as a reducing agent to the intermediate semiconductor device including the first conductive layer 103. Example process pressure of the bulk step of the third chemical vapor deposition may be between about 10 Torr and about 500 Torr. Example substrate temperature of the bulk step of the third chemical vapor deposition may be between about 250° C. and about 495° C. The tungsten-containing precursor of the bulk step of the third chemical vapor deposition may be, for example, tungsten hexafluoride, tungsten chloride, or tungsten hexacarbonyl. The reducing agent of the bulk step of the third chemical vapor deposition may be, for example, hydrogen gas, silane, disilane, hydrazine, diborane, or germane. By including the bulk step rather than relying on the deposition cycles, the expanded hole 403 may be filled up in a shorter time.

Since the first conductive layer 103 formed by using the second chemical vapor deposition can provide good coverage at the sidewall of the expanded hole 403, the subsequently formed first conductive structure 105 can fill up the expanded hole 403 without a void sealed therein. Therefore, the first conductive structure 105 can be formed with improved conductivity.

In some embodiments, the repeat times of the deposition cycles of the third chemical vapor deposition may be less than the repeat times of the deposition cycles of the second chemical vapor deposition. In some embodiments, the repeat times of the deposition cycles of the third chemical vapor deposition and the repeat times of the deposition cycles of the second chemical vapor deposition may be the same or substantially the same.

In some embodiments, the grain size of tungsten of the first conductive structure 105 may be greater than 30 nm, than 50 nm, than 70 nm, than 80 nm, than 85 nm, or than 87 nm. In some embodiments, the first conductive structure 105 may include alpha phase tungsten.

With reference to FIG. 11, a planarization process, such as chemical mechanical polishing, may be performed until the top surface 203TS of the first dielectric layer 203 is exposed to remove excess material and provide a substantially flat surface for subsequent processing steps. After the planarization process, the remaining adhesive layer 101, the remaining first conductive layer 103, and the remaining first conductive structure 105 together configure the composite contact structure 100.

It should be noted that the shape of the first conductive structure 105 may be determined by the expanded hole 403 so that the first conductive structure 105 may have a bottle-shaped cross-sectional profile. For example, the width W4 of the middle portion 105MP of the first conductive structure 105 may be greater than the width W5 of the top portion 105TP of the first conductive structure 105 or the width W6 of the bottom portion 105BP of the first conductive structure 105. In some embodiments, the width W5 of the top portion 105TP of the first conductive structure 105 and the width W6 of the bottom portion 105BP of the first conductive structure 105 may be substantially the same. In some embodiments, the width W5 of the top portion 105TP of the first conductive structure 105 and the width W6 of the bottom portion 105BP of the first conductive structure 105 may be different. For example, the width W5 of the top portion 105TP of the first conductive structure 105 may be less than the width W6 of the bottom portion 105BP of the first conductive structure 105.

One aspect of the present disclosure provides a semiconductor device including a substrate; a first dielectric layer positioned on the substrate; a first conductive structure positioned in the first dielectric layer and including a bottle-shaped cross-sectional profile; a first conductive layer positioned between the first conductive structure and the first dielectric layer and between the first conductive structure and the substrate; an adhesive layer positioned between the first conductive layer and the first dielectric layer and between the first conductive layer and the substrate. The adhesive layer, the first conductive layer, and the first conductive structure together configure a composite contact structure. An aspect ratio of the composite contact structure is greater than 7.

Another aspect of the present disclosure provides a method for fabricating a semiconductor device including forming a first dielectric layer on a substrate; forming an expanded hole in the first dielectric layer; conformally forming an adhesive layer in the expanded hole by a first chemical vapor deposition process; conformally forming a first conductive layer on the adhesive layer by a second chemical vapor deposition process; and forming a first conductive structure on the first conductive layer by a third chemical vapor deposition process. The adhesive layer, the first conductive layer, and the first conductive structure together configure a composite contact structure. The second chemical vapor deposition process includes an initial deposition step and subsequent deposition cycles repeated until the first conductive layer is formed to a predetermined thickness.

Another aspect of the present disclosure provides a method for fabricating a semiconductor device including forming a first dielectric layer on a substrate; forming an expanded hole in the first dielectric layer; conformally forming an adhesive layer in the expanded hole by a first chemical vapor deposition process; conformally forming a first conductive layer on the adhesive layer by a second chemical vapor deposition process; performing a post-treatment to the first conductive layer; forming a first conductive structure on the first conductive layer by a third chemical vapor deposition process. The adhesive layer, the first conductive layer, and the first conductive structure together configure a composite contact structure. The second chemical vapor deposition process includes an initial deposition step and subsequent deposition cycles repeated until the first conductive layer is formed to a predetermined thickness. The post-treatment includes introducing diborane pulses to the first conductive layer.

Due to the design of the method for fabricating the semiconductor device of the present disclosure, the sidewall coverage may be improved by increasing repeating times of the deposition cycles of the second chemical vapor deposition process. In addition, the first conductive structure 105 may have greater grain size and improved resistivity by employing the post-treatment to the first conductive layer 103.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   forming a first dielectric layer on a substrate;
   forming an expanded hole in the first dielectric layer;
   conformally forming an adhesive layer in the expanded hole by a first chemical vapor deposition process, wherein the adhesive layer includes a bottom portion disposed on the substrate and a sidewall portion disposed on the first dielectric layer, and a thickness of the bottom portion of the adhesive layer is greater than a thickness of the sidewall portion of the adhesive layer, wherein a thickness of the sidewall portion of the adhesive layer gradually decreases from bottom ends of the expanded hole towards top ends of the expanded hole, wherein the adhesive layer is formed of titanium, titanium nitride, or tantalum, tantalum nitride;
   conformally forming a first conductive layer on the adhesive layer by a second chemical vapor deposition process, wherein the first conductive layer includes a bottom portion disposed on the bottom portion of the adhesive layer and a sidewall portion disposed on the sidewall portion of the adhesive layer, and a thickness of the bottom portion of the first conductive layer gradually decreases from the bottom ends of the expanded hole towards the top ends of the expanded hole; and
   forming a first conductive structure on the first conductive layer by a third chemical vapor deposition process;
   wherein the adhesive layer, the first conductive layer, and the first conductive structure together configure a composite contact structure;
   wherein the second chemical vapor deposition process comprises an initial deposition step and subsequent deposition cycles repeated until the first conductive layer is formed to a predetermined thickness, wherein one deposition cycle of the deposition cycles of the second chemical vapor deposition process comprises exposing the adhesive layer to a pulse of a silicon-containing reducing agent and then exposing the adhesive layer to a pulse of a tungsten-containing precursor after the exposure to the pulse of the silicon-containing reducing agent.

2. The method for fabricating the semiconductor device of claim 1, further comprising performing an etching process to remove overhang of the first conductive layer.

3. The method for fabricating the semiconductor device of claim 2, wherein the initial deposition step of the second chemical vapor deposition process comprises introducing a borane-containing precursor pulse and a subsequent tungsten-containing precursor pulse.

4. The method for fabricating the semiconductor device of claim 3, wherein the borane-containing precursor pulse of the initial deposition step of the second chemical vapor deposition process comprises borane, diborane, triborane, or boron halides with hydrogen.

5. The method for fabricating the semiconductor device of claim 4, wherein the tungsten-containing precursor pulse of the initial deposition step of the second chemical vapor deposition process comprises tungsten hexafluoride, tungsten hexachloride, or tungsten hexacarbonyl.

6. The method for fabricating the semiconductor device of claim 5, wherein a substrate temperature during introducing the borane-containing precursor pulse of the initial deposition step of the second chemical vapor deposition process is between about 200° C. and about 475° C.

7. The method for fabricating the semiconductor device of claim 6, wherein a chamber pressure during introducing the borane-containing precursor pulse of the initial deposition step of the second chemical vapor deposition process is between about 1 Torr and about 350 Torr.

8. The method for fabricating the semiconductor device of claim 7, wherein a substrate temperature during introducing the tungsten-containing precursor pulse of the initial deposition step of the second chemical vapor deposition process is between about 200° C. and about 475° C.

9. The method for fabricating the semiconductor device of claim 8, wherein a chamber pressure during introducing the tungsten-containing precursor pulse of the initial deposition step of the second chemical vapor deposition process is between about 1 Torr and about 350 Torr.

10. The method for fabricating the semiconductor device of claim 1, wherein the silicon-containing reducing agent of the deposition cycles of the second chemical vapor deposition process comprises silane.

11. The method for fabricating the semiconductor device of claim 10, wherein the tungsten-containing precursor of the deposition cycles of the second chemical vapor deposition process comprises tungsten hexafluoride, tungsten hexachloride, or tungsten hexacarbonyl.

12. The method for fabricating the semiconductor device of claim 11, wherein a substrate temperature during introducing the pulse of the silicon-containing reducing agent of the deposition cycles of the second chemical vapor deposition process is between about 200° C. and about 475° C.

13. The method for fabricating the semiconductor device of claim 12, wherein a chamber pressure during introducing the pulse of the silicon-containing reducing agent of the deposition cycles of the second chemical vapor deposition process is between about 1 Torr and about 350 Torr.

14. The method for fabricating the semiconductor device of claim 13, wherein a substrate temperature during introducing the pulse of the tungsten-containing precursor of the deposition cycles of the second chemical vapor deposition process is between about 200° C. and about 475° C.

15. The method for fabricating the semiconductor device of claim 14, wherein a chamber pressure during introducing the pulse of the tungsten-containing precursor of the deposition cycles of the second chemical vapor deposition process is about 1 Torr and about 350 Torr.

16. The method for fabricating the semiconductor device of claim 15, wherein a width of top ends of the expanded hole is less than a width of middle ends of the expanded hole.

17. The method for fabricating the semiconductor device of claim 16, wherein an aspect ratio of the expanded hole is greater than 7.

18. The method for fabricating the semiconductor device of claim 17, wherein the third chemical vapor deposition process comprises an initial deposition step, a deposition cycles, and a bulk step;
wherein the bulk step of the third chemical vapor deposition comprises sequentially introducing a tungsten-containing precursor and a reducing agent;
wherein the tungsten-containing precursor comprises tungsten hexafluoride, tungsten chloride, or tungsten hexacarbonyl, and the reducing agent comprises hydrogen gas, silane, disilane, hydrazine, diborane, or germane.

19. A method for fabricating a semiconductor device, comprising:
forming a first dielectric layer on a substrate;
forming an expanded hole in the first dielectric layer;
conformally forming an adhesive layer in the expanded hole by a first chemical vapor deposition process, wherein the adhesive layer includes a bottom portion disposed on the substrate and a sidewall portion disposed on the first dielectric layer, and a thickness of the bottom portion of the adhesive layer is greater than a thickness of the sidewall portion of the adhesive layer, wherein a thickness of the sidewall portion of the adhesive layer gradually decreases from bottom ends of the expanded hole towards top ends of the expanded hole, wherein the adhesive layer is formed of titanium, titanium nitride, or tantalum, tantalum nitride;
conformally forming a first conductive layer on the adhesive layer by a second chemical vapor deposition process, wherein the first conductive layer includes a bottom portion disposed on the bottom portion of the adhesive layer and a sidewall portion disposed on the sidewall portion of the adhesive layer, and a thickness of the bottom portion of the first conductive layer gradually decreases from the bottom ends of the expanded hole towards the top ends of the expanded hole;
performing a post-treatment to the first conductive layer;
forming a first conductive structure on the first conductive layer by a third chemical vapor deposition process;
wherein the adhesive layer, the first conductive layer, and the first conductive structure together configure a composite contact structure;
wherein the second chemical vapor deposition process comprises an initial deposition step and subsequent deposition cycles repeated until the first conductive layer is formed to a predetermined thickness, wherein one deposition cycle of the deposition cycles of the second chemical vapor deposition process comprises exposing the adhesive layer to a pulse of a silicon-containing reducing agent and then exposing the adhesive layer to a pulse of a tungsten-containing precursor after the exposure to the pulse of the silicon-containing reducing agent;
wherein the post-treatment comprises introducing diborane pulses to the first conductive layer.

* * * * *